(12) United States Patent
Ho et al.

(10) Patent No.: US 6,717,264 B2
(45) Date of Patent: Apr. 6, 2004

(54) HIGH DENSITY INTEGRATED CIRCUIT PACKAGE

(75) Inventors: Kwun-Yao Ho, Taipei (TW); Moriss Kung, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/245,683

(22) Filed: Sep. 18, 2002

(65) Prior Publication Data

US 2003/0218249 A1 Nov. 27, 2003

(30) Foreign Application Priority Data

May 27, 2002 (TW) ........................................ 91111222 A

(51) Int. Cl.$^7$ ............................................... H01L 23/48
(52) U.S. Cl. ........................ 257/738; 257/773; 257/779; 257/781; 257/786
(58) Field of Search ................................. 257/772, 734, 257/737, 738, 778–783, 786, 787; 438/622, 106–109, 612–615

(56) References Cited

U.S. PATENT DOCUMENTS

| | | | | |
|---|---|---|---|---|
| 4,120,843 A | * | 10/1978 | Ameen et al. | 524/609 |
| 5,767,575 A | * | 6/1998 | Lan et al. | 257/701 |
| 6,330,967 B1 | * | 12/2001 | Milewski et al. | 228/180.22 |
| 6,396,707 B1 | * | 5/2002 | Huang et al. | 361/760 |

* cited by examiner

*Primary Examiner*—Alonzo Chambliss
(74) *Attorney, Agent, or Firm*—Rosenberg, Klein & Lee

(57) ABSTRACT

A high-density integrated circuit package and a method for the same. The package includes a substrate having a plurality of bump pads and a plurality of conductive lines on the surface, wherein a solder wettable material is on the top surface of each bump pad, a dielectric material is on the top surface of each conductive line for protection, and a solder non-wettable material is formed on the sidewall of each conductive line and each bump pad for protection and avoiding the problem of short circuit, and a chip having a plurality of bumps on a surface corresponding to the bump pads respectively and electric connecting with the bump pads.

8 Claims, 9 Drawing Sheets

HIGH DENSITY INTEGRATED CIRCUIT PACKAGE

BACKGROUND OF THE INVENTION

1. Field of the Invention

This invention relates to an integrated circuits package, especially to a high-density integrated circuit package and a method for the same to increase layout circuit density, the reliability of the integrated circuit package and the efficiency of the packaging integrated circuit process.

2. Description of the Prior Art

Integrated circuits are typically housed within a plastic package commonly referred to as a quad flat pack (QFP). Flat packs contain a lead frame, which has a plurality of leads that are connected to an integrated circuit die. The die is encapsulated by a hard plastic housing, which mechanically supports and electrically insulates the integrated circuit. The leads are typically soldered to a printed circuit board.

Packaging techniques for integrated circuits have been developed in the past in an attempt to satisfy requirements for miniaturization in the integrated circuit industry. Improved methods for miniaturization of integrated circuits enabling the integration of millions of transistor circuit elements into a single integrated silicon embodied circuit, or a chip, has resulted in an increased emphasis on methods to package these circuits with space efficiency.

Integrated circuits are created from a silicon wafer using various etching, doping, depositing and cutting steps that are well know in the art of fabricating integrated circuit devices. A silicon wafer may be comprised of a number of integrated circuit dies that each represents a single integrated circuit chip. Ultimately, transfer molding plastic encasements around the chip with a variety of pin-out or mounting and interconnection schemes may package the chip. For example, M-Dip (Dual-In-Line-Plastic) provides a relatively flat, molded package having dual parallel rows of leads extending from the bottom for through-hole connection and mounting to an underlying printed circuit board. More compact integrated circuits allowing greater density on a printed circuit board are the SIP (Single-In-Line-Plastic), and SOJ (Small Outline J-leaded) molded case packages.

According to number of chips in the integrated circuit packages, the integrated circuit packages can be divided into a single chip package (SCP) type and a multi-chip package (MCP) type. The multi-chip package type also comprises a multi-chip module (MCM) type. According to a type for coupling a substrate and an element, the integrated circuit packages can be divided into a pin-through-hole (PTH) type and a surface mount technology (SMT) type. A lead frame of the pin-through-hole type element is thin acicular or a sheet metal to be inserted into a socket or a via of the substrate and to be fixed by using soldering process. The surface mount technology type element is adhered directly on the substrate and then is fixed by using a soldering process. At present, the more advanced process for packaging integrated circuits is a direct chip attached (DCA) packaging process to decrease the size and to increase the layout density of the integrated circuit package. The direct chip attached packaging process is to fix the integrated circuit chip on the substrate directly and then to couple the circuit elements with each other.

Referring to FIG. 1, this shows a diagram in fixing a chip on a substrate with a solder mask. At first, a substrate 10, a dielectric compound 50 and a chip 40 is provided, wherein the substrate comprises a plurality of conducting lines 25, a plurality of the bump pads 20, solder mask 30 and a plurality of solder balls 17. The chip 40 comprises a plurality of solder bumps 15. The plural solder bumps 15 are coupled to the chip 40. Then chip 40 is coupled to the plural bump pads 20 which are on the substrate 10. The plural solder bumps 15 are used to electrically connect the chip 40 and the substrate 10, wherein each solder bump 15 corresponds to each bump pad 20 respectively.

In the traditional integrated circuit package, the objective of using solder mask 30 is to avoid the conducting lines 25 from outside environmental damage, and to prevent a short circuit and an overflow of the solder bumps 15 in the following process. Therefore, in the traditional integrated circuit package with a solder mask, the solder mask 30 must cover on the conducting lines 25 for protection. In order to provide better protective capabilities, the solder mask 30 must further cover partially on each bump pad 20 on substrate 10 to avoid a short circuit and an overflow of solder bumps 15 in the following process. Because a solder mask 30 covers partially on each bump pad 20 of substrate 10, an extra space around each bump pad 20 must be reserved for connecting the solder bump with enough allowance and tolerance in the traditional integrated circuit package with a solder mask. Because of the extra space needed, the number of the conducting lines, which are located between any of the two bump pad 20's on substrate 10, will be limited. Therefore, the traditional technology is limited for the smaller and smaller integrated circuit package requirement.

Because the solder mask must cover partially on each bump pad in the integrated circuit package, the misalignment between the solder bumps and the bump pads will affect the quality of the integrated circuit package. Furthermore, for the flip chip package (FCP) type, the connection between the solder mask and the underfill is so weak that the solder mask could peel off to result a problem of lower reliability.

SUMMARY OF THE INVENTION

In accordance with the background of the abovementioned invention, the layout circuit density of the traditional integrated circuit package with a solder mask cannot be increased and the solder mask could peel off to cause a short circuit defect. The present invention provides a high-density integrated circuit package and a method for the same to avoid short circuit defects by using solder wettable metal as the material of the bump pads, forming the dielectric layer on the outermost conducting lines, and forming an insulation layer with solder non-wettability on the sidewall of the conducting lines and the bump pads.

The second objective of this invention is to increase the layout circuit density on the substrate of the integrated circuit package due to no extra space required for solder mask and pad land, The third objective of this invention is to increase the reliability of the integrated circuit package due to more area contacted directly to molding or underfill material.

The fourth objective of this invention is to increase the yield of the integrated circuit package due to eliminating solder mask and photoresist process.

The further objective of this invention is to achieve a lower cost and a fast cycle time due to less photolithography processes and equipments used.

In accordance with the foregoing objectives, the present invention provides a high-density integrated circuit package and a method for the same to avoid short circuit defects, by using solder wettable metal as the material of the bump pads, forming the dielectric layer on the outermost conducting lines, and forming an insulation layer with solder non-wettability on the sidewall of the conducting lines and the bump pads. The high-density integrated circuit package of this invention including: a substrate, which has a plurality of bump pads and a plurality of conductive lines on a surface, wherein a solder wettable material is on the top surface of each bump pad, a dielectric material is on the top surface of each conductive line for protection, and a solder non-wettable material is formed on the sidewall of each conductive line and each bump pads for protection and avoiding the problem of short circuit; and a chip, which has a plurality of bumps on a surface corresponding to the bump pads respectively and electric connecting with the bump pads. The package can be a molding compound mode or an underfill mode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

The present invention provides a high-density integrated circuit package and a method for the same to avoid short circuit defects, by using solder wettable metal as the material of the pads, forming the dielectric layer on the, and forming an insulation layer on the sidewall of the by using solder wettable metal as the material of the bump bump pad, forming the dielectric layer on the outermost conducting lines, and forming an insulation layer with solder non-wettability on the sidewall of the conducting lines and the bump pads.

Figure 1:
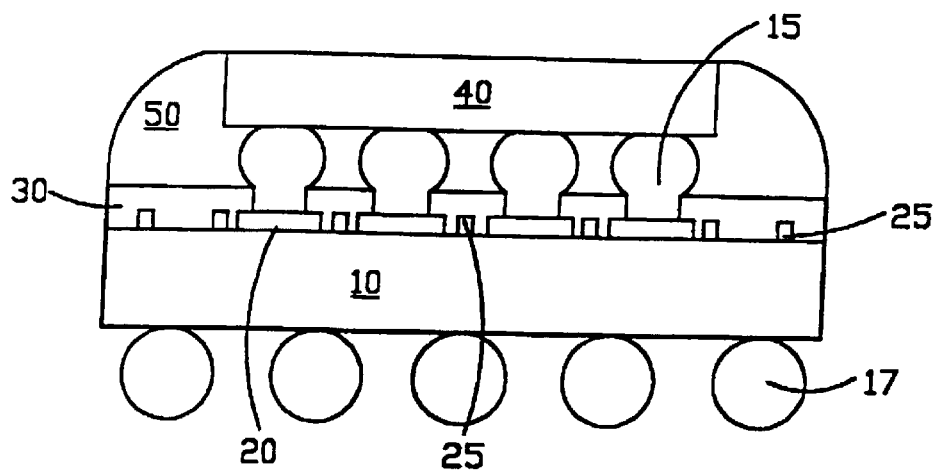
FIG. 1 shows a diagram in using the traditional method to attach a chip on the substrate with a solder mask.
Figure 2:
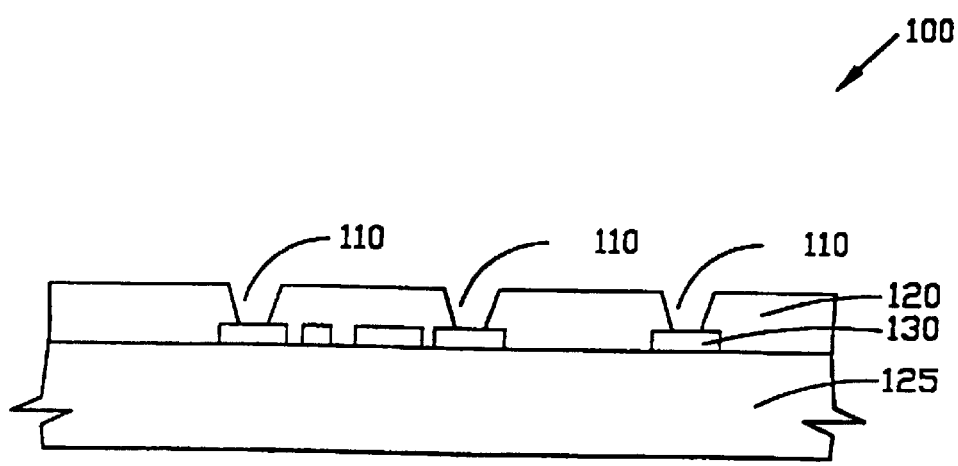
FIG. 2 shows a diagram of the substrate according to the present invention.

Referring to FIG. 2, this shows a diagram of the substrate. The present invention provides a substrate 100 at first, wherein a surface of the substrate 100 comprises the first dielectric layer 120 having a plurality of openings 110. The inner structure of the substrate 100 comprises the second dielectric layer 125 and a first metal layer 130, wherein the second dielectric layer 125 and part of the first metal layer 130 is covered by the first dielectric layer 120. The first metal layer 130 is formed on part of the second dielectric layer 125 and is located between the first dielectric layer 120 and the second dielectric layer 125. A bottom of each opening 110 exposes the first metal layer 130.

Figure 3:
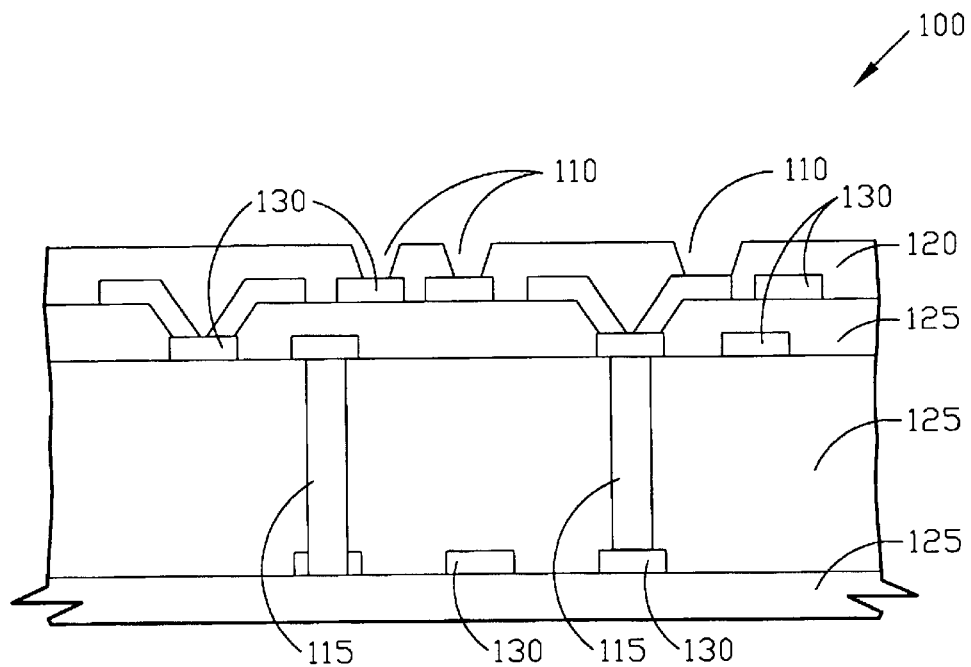
FIG. 3 shows another diagram of the substrate according to present invention.

Referring to FIG. 3, this shows another diagram of the substrate. The present invention provides a substrate 100 at first, wherein a surface of the substrate 100 comprises the first dielectric layer 120 with a plurality of openings 110. The inner structure of the substrate 100 comprises the second dielectric layer 125, a plurality of the plated through holes (PTHs) 115, and a plurality of the first metal layers 130, wherein the second dielectric layer 125 and part of the first metal layer 130 is covered by the first dielectric layer 120. The plurality of the first metal layer 130 is formed on part of the second dielectric layer 125 and is located between the first dielectric layer 120 and the second dielectric layer 125. A bottom of each opening 110 exposes the first metal layer 130. The surface of the substrate 100 used in the present invention comprises the first dielectric layer 120 with a plurality of the openings 110 but the inner structure of the substrate 100 is not limited.

Figure 4A:
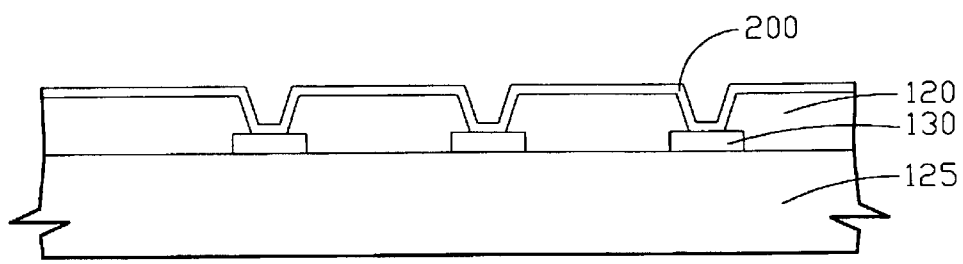
FIG. 4A shows a diagram in forming the second metal layer on the substrate according to the first embodiment of the present invention.

The following description is one embodiment of the present invention and a scope of the present invention is not limited. Referring to FIG. 4A, this shows a diagram in forming the second metal layer on the substrate. The second metal layer 200 is formed on a surface of the substrate 100. The second metal layer 200, which is used as the conductive circuit layer of the surface of the substrate 100, is formed on the first dielectric layer 120 and is formed at the bottom and on the sidewalls of each via 110. A material of the second metal layer 200 is various depending on the needs of individual products. In usual procedures, the material of the second metal layer 200 is plating copper.

Figure 4B:
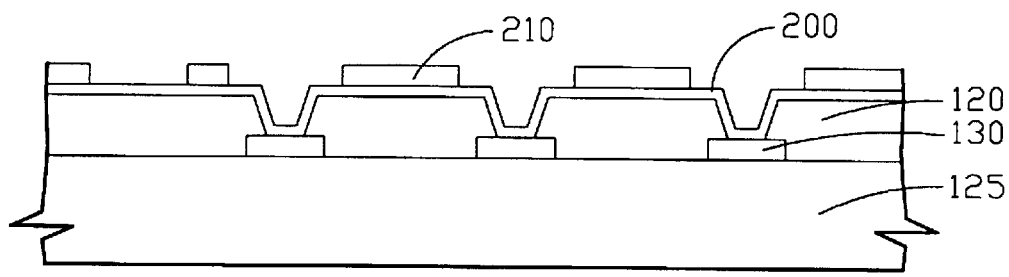
FIG. 4B shows a diagram in forming the third dielectric layer on part of the second metal layer according to the first embodiment of the present invention.

Referring to FIG. 4B, this shows a diagram in forming the third dielectric layer on part of the second metal layer. A third dielectric layer 210 is formed on the second metal layer 200 and fills full of each via 110. Then locations of the bump pads are defined on the third dielectric layer 210 and part of the third dielectric layer 210 is removed to expose part of the second metal layer 200. In the removing part of the third dielectric layer 210 process, a laser process or a plasma etching process is used. Therefore, a photo resist layer is not used to protect circuit elements, which are on the substrate 100, in the removing part of the third dielectric layer 210 process.

Figure 4C:
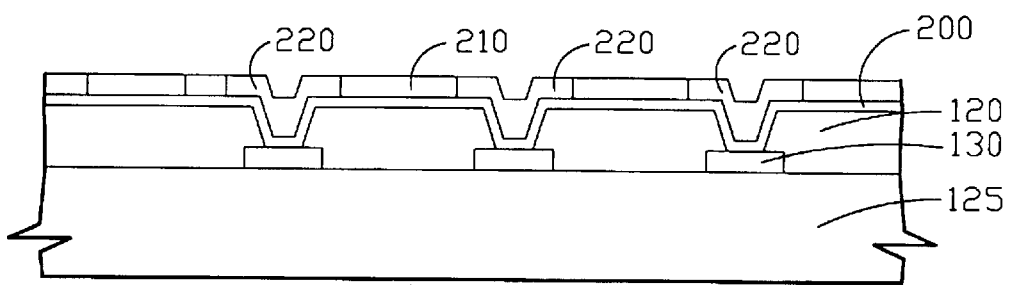
FIG. 4C shows a diagram in forming a solder wettable material layer on part of the second metal layer according to the first embodiment of the present invention.

Referring to FIG. 4C, this shows a diagram in forming a solder wettable material layer on part of the second metal layer. A solder wettable material layer 220 is formed on the exposed second metal layer 200. The solder wettable material can be nickel (Ni)/gold, Tin (Sn)/Lead (Pb), Tin, Lead, or Silver (Ag). The thickness of the solder wettable material layer 220 can be various depending on different products and processes. In usual methods, an electric/chemical electroplating process or a physical/chemical deposition process is used for forming the solder wettable material.

Figure 4D:
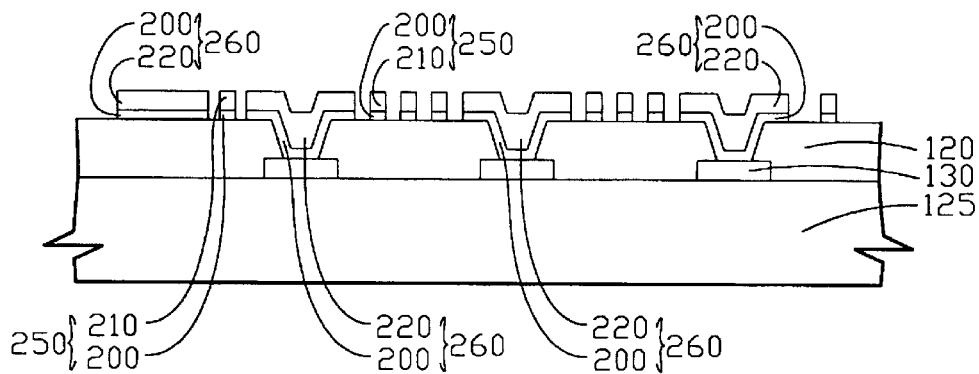
FIG. 4D shows a diagram in forming conductive lines and solder interfaces on part of the first dielectric layer according to the first embodiment of the present invention.

Referring to FIG. 4D, this shows a diagram in forming conductive lines and bump pads on part of the first dielectric layer. The locations of the conductive lines, which are on the surface of the substrate 100, are defined on the third dielectric layer 210. Then the laser process or the plasma etching process is used to remove part of the third dielectric layer 210 and a plasma cleaning process is used to clean the surface of the substrate 100. Then part of the second metal layer 200 is removed to form a plurality of conductive lines 250 and a plurality of bump pads 260 on the first dielectric layer 120, wherein each conductive line comprises the third dielectric layer 210 and the second metal layer 200 and each bump pad comprises the solder wettable material 220 and the second metal layer 200. In the following processes, the solder bumps can be coupled directly to the bump pads 260. Because the laser process is used to remove part of the third dielectric layer 210 and the plasma cleaning process is used to clean the surface of the substrate, the photo resist layer is not used in removing the third dielectric layer process. In removing part of the second metal layer 200 process, each conductive line is protected by the third dielectric layer 210 The locations of the bump pads 260 on the first dielectric layer 120 are used to couple solder bumps or other conductive wires in the following process. In order to cooperate needs of the products and processes, a pre-soldering (not showing in the figures) is formed on the bump pad 260 in usual to increase the coupling reliability after coupling the chip to the substrate.

Figure 4E:
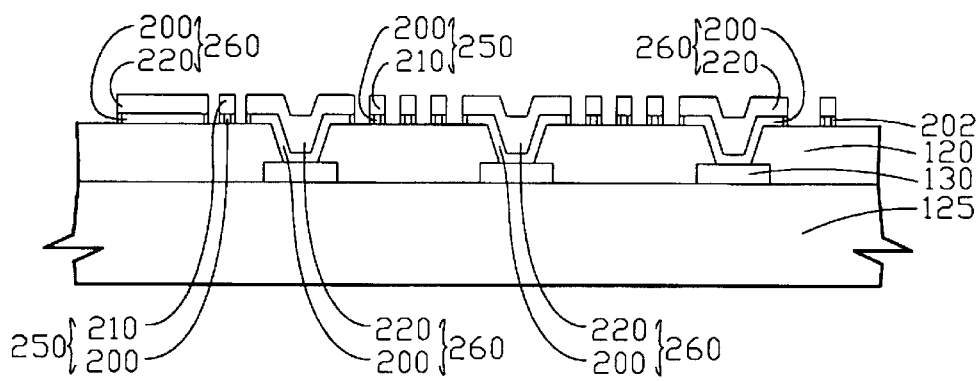
FIG. 4E shows a diagram in forming an insulation layer on sidewalls of the second metal layer according to the first embodiment of the present invention.

Referring to FIG. 4E, this shows a diagram in forming an insulation layer on sidewalls of the second metal layer. After forming a plurality of conductive lines 250 and a plurality of bump pads 260 on the first dielectric layer 120, an insulation layer 202 with solder non-wettability is formed on the sidewalls of the second metal layers. The main objective of the insulation layer 202 is to protect the integrated circuit package without a solder mask from short circuit defects when the solder bump may overflow in the following process. In usual methods, the substrate 100 is proceeded with an oxidation process to form a metal oxide layer, which is used as the insulation layer 202, on the sidewall surface of the second metal layer 200. The third dielectric layer 210 and the insulation layer 202 used for protection. A thickness of the insulation layer 202 can be various depending on the needs of different products and processes. The formation of insulation layer 202 is optional because the sidewall can also be protected by underfill or molding compound in the following process.

After forming the insulation layer on the sidewall surface of the second metal layer, a release film (not shown in the figures) can be attached on the surface of the substrate to avoid surface pollutants from the outside environment, or scrapes on the surface of the substrate when the substrate is in transportation to following processes. After the substrate is transported to the next process, the release film can be easily stripped from the surface of the substrate. After passing through a simple cleaning process or glue residual removing process, the substrate can proceed directly with the next process.

Figure 4F:
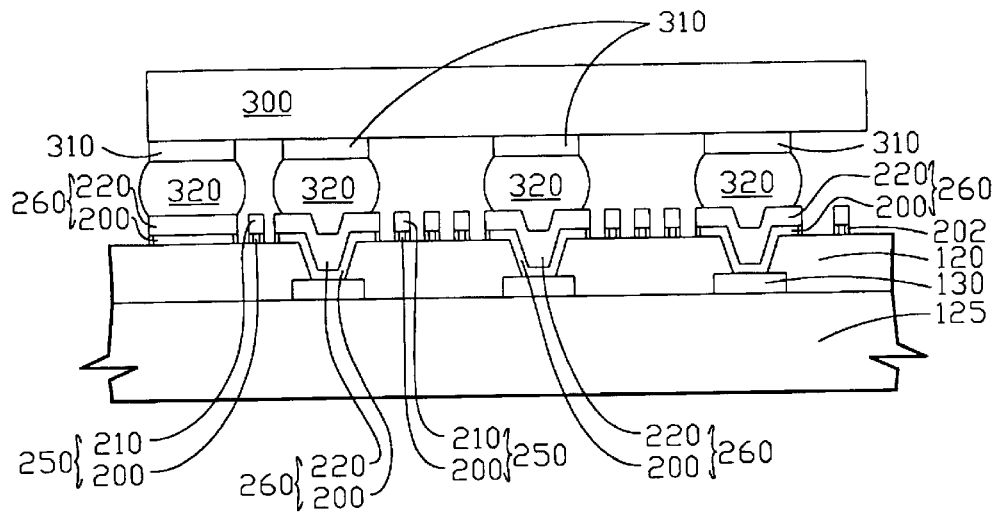
FIG. 4F shows a diagram in attaching the chip on the substrate according to the first embodiment of the present invention.

Referring to FIG. 4F, this shows a diagram in connecting the chip on the substrate. A chip 300 can be coupled to a substrate 100. The chip 300 has a plurality of bumps 320 attached on a plurality of die pads 310 respectively. The chip further comprises a protecting layer to protect the chip and to avoid damage and defects that occur during the heating process. The plural bumps 320 are connected to the plural bump pads 130 which are on the substrate 100 respectively, by using a heating process to fix the chip 300 on the substrate 100. Because a solder mask is not used in the present invention and there are no alignment problems when the first solder bump 320 is coupled to the bump pad 130, the present invention can increase production efficiency and decrease production costs of the integrated circuit package. Fixing the chip on the substrate is one embodiment of the present invention, and a scope of the present invention that is not limited. The present invention can further use the bump pad as a solder interface to connect other devices by conductive wires.

Figure 4G:
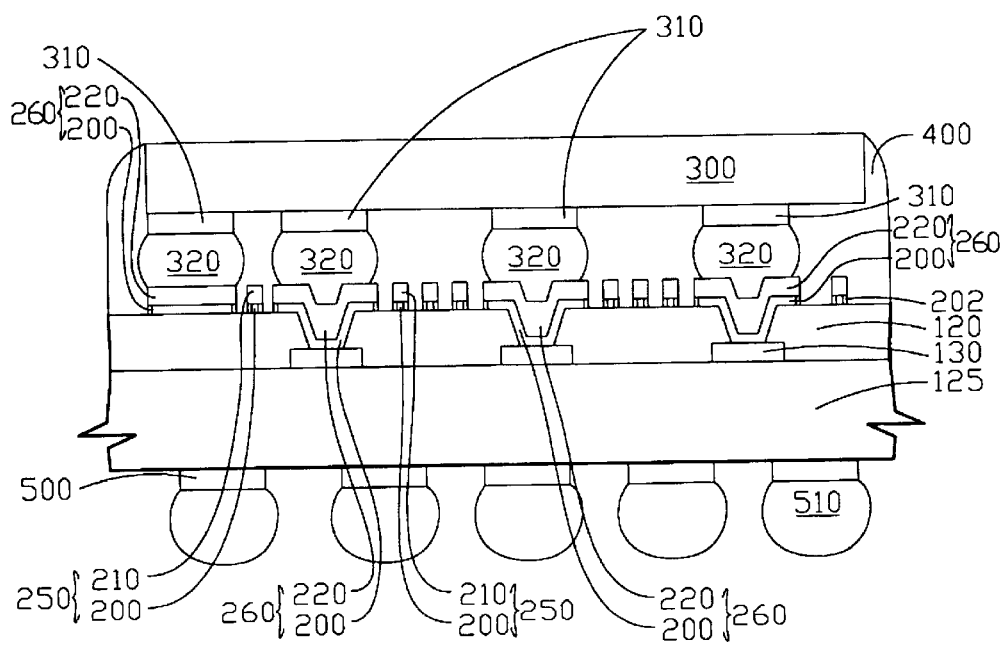
FIG. 4G shows a diagram in forming a flip-chip ball grid array (FCBGA) package in molding compound mode according to the first embodiment of the present invention.
Figure 5A:
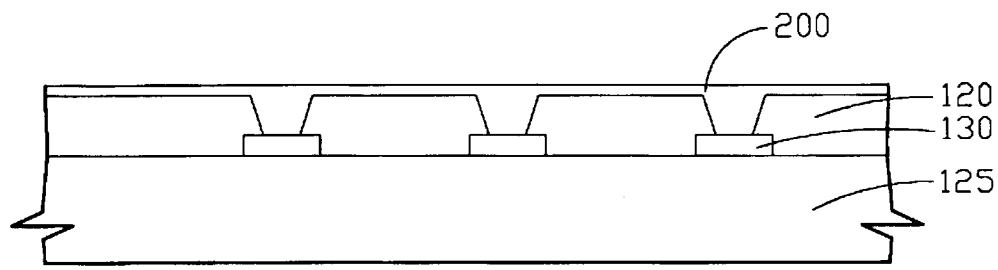
FIG. 5A shows a diagram in forming the second metal layer on the substrate according to the second embodiment of the present invention.
Figure 5B:
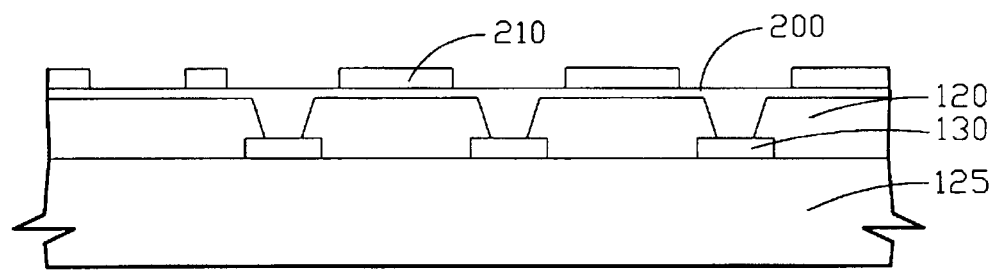
FIG. 5B shows a diagram in forming the third dielectric layer on part of the second metal layer according to the second embodiment of the present invention.
Figure 5C:
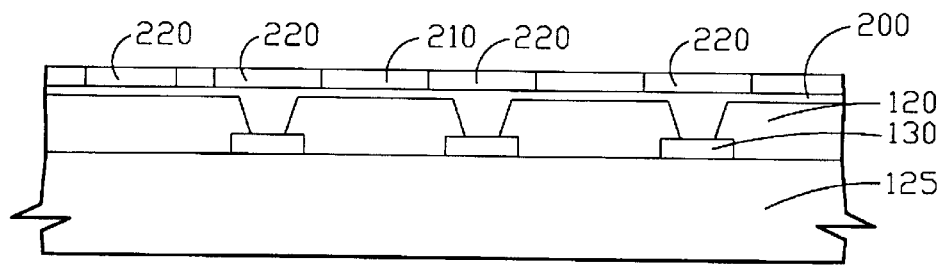
FIG. 5C shows a diagram in forming a solder wettable material layer on part of the second metal layer according to the second embodiment of the present invention.
Figure 5D:
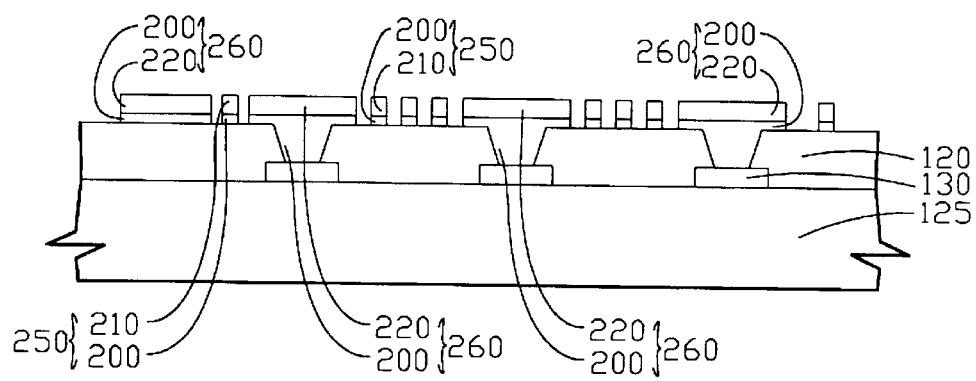
FIG. 5D shows a diagram in forming conductive lines and solder interfaces on part of the first dielectric layer according to the second embodiment of the present invention.
Figure 5E:
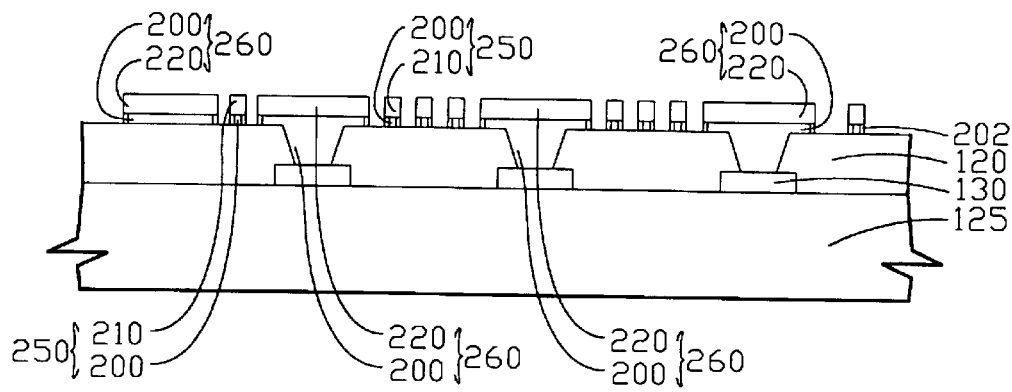
FIG. 5E shows a diagram in forming an insulation layer on sidewalls of the second metal layer according to the second embodiment of the present invention.
Figure 5F:
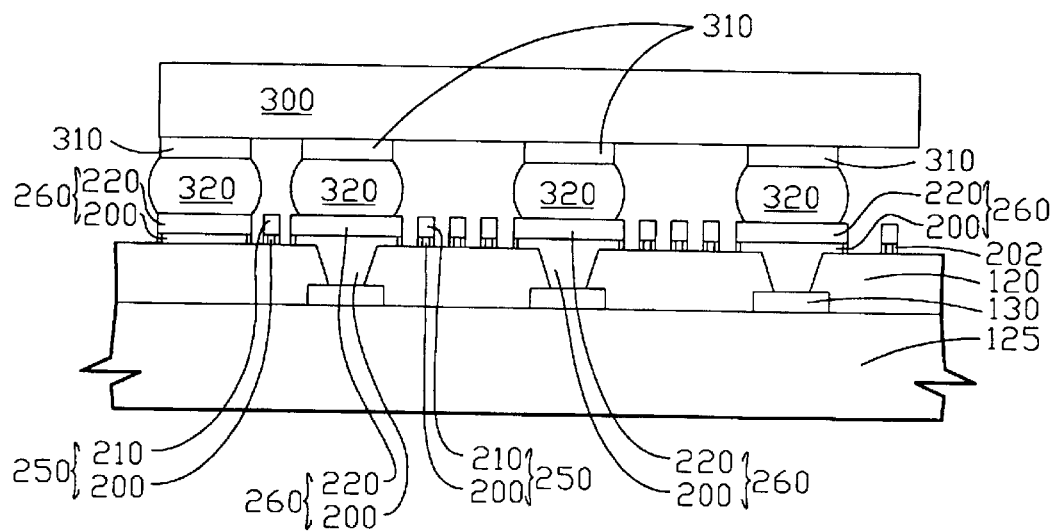
FIG. 5F shows a diagram in attaching the chip on the substrate according to the second embodiment of the present invention.
Figure 5G:
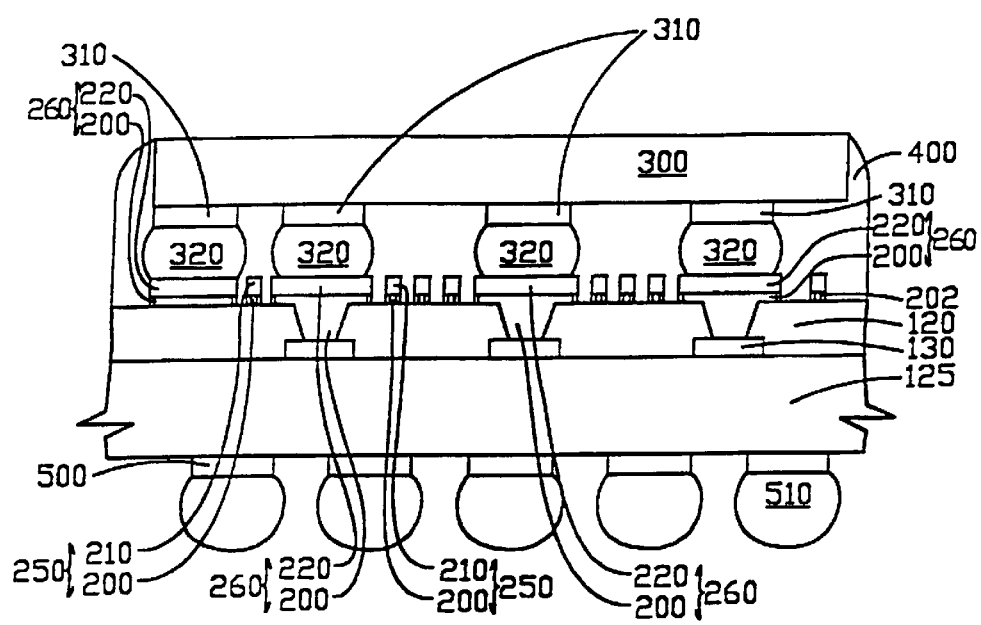
FIG. 5G shows a diagram in forming a flip-chip ball grid array (FCBGA) package in molding compound mode according to the second embodiment of the present invention.

Referring to FIG. 4G, this shows a diagram in forming a flip-chip ball grid array (FCBGA) package in molding compound mode. After connecting the chip 300 on the substrate 100, the chip 300 and connection locations between the chip 300 and the substrate can be covered by using a package molding compound mold 400 or an underfill mode that protects the circuits. Then the process for packaging the integrated circuit without a solder mask is finished. A plurality of solder balls 510 can be coupled to the bottom of the substrate by using a plurality of ball pads 500 to make the integrated circuit package without a solder mask electric connection to other device. Using the plural solder balls 510 attached to the bottom of the substrate 100 is one embodiment of the present invention and the scope of the present invention is not limited.

FIG. 5A to FIG. 5G show another embodiment of the present invention. The processes in this embodiment are almost the same as the previous embodiment. What the difference between the two embodiments is the bump pad structure depending on the formation of second metal layer 200. In the previous embodiment, the second metal layer 200 is formed to cover the first dielectric layer 120 and the bottom and sidewall of the openings 110. However, referring to FIG. 5A in this embodiment, the second metal layer 200 can be formed to cover the first dielectric layer 120 and fully fill the openings 110 as copper filling vias.

In accordance with the present invention, because a solder mask is not used in the present invention, no extra space around of the bump pad be needed, thus more circuits can be laid between any of the two bump pads. This condition can increase the layout density of the integrated circuit package without a solder mask successfully, and increase the reliability of the integrated circuit package.

In accordance with the present invention, the present invention provides a high-density integrated circuit package and a method for the same to avoid short circuit defects, by using solder wettable metal as the material of the bump pads, forming the dielectric layer on the outermost conducting lines, and forming an insulation layer with solder non-wettability on the sidewall of the conducting lines and the bump pads. The high-density integrated circuit package structure of this invention including: a substrate, which has a plurality of bump pads and a plurality of conductive lines on a surface, wherein a solder wettable material is on the top surface of each bump pad, a dielectric material is on the top surface of each conductive line for protection, and a solder non-wettable material is formed on the sidewall of each conductive line and each bump pads for protection and avoiding the problem of short circuit; and a chip, which has a plurality of bumps on a surface corresponding to the bump pads respectively and electric connecting with the bump pads. The package can be a molding compound mode or an underfill mode. Using the method of the present invention can increase the circuit density on the substrate and the reliability of the integrated circuit package. Using the method of the present invention can also increase the yield and the production efficiency of the integrated circuit package. Using the method of the present invention can further decrease production costs of the integrated circuit package.

Although specific embodiments have been illustrated and described, it will be obvious to those skilled in the art that various modifications may be made without departing from what is intended to be limited solely by the appended claims.

What is claimed is:

1. A high-density integrated circuit package, comprising:
   a substrate, said substrate including a plurality of bump pads and a plurality of conductive lines on a surface of said substrate, a solder wettable material formed on the top surface of each of said plurality of the bump pads, and a plurality of separated dielectric layer structures, each disposed on the top surface of a respective one of said conductive lines and patterned in precise registration therewith; and
   a chip, said chip including a plurality of bumps on a surface thereof in alignment with said bump pads respectively and electrically connected with said bump pads.

2. The package according to claim 1, wherein said conductive lines are made of copper.

3. The package according to claim 1, wherein said bump pads are made of copper.

4. The package according to claim 3, wherein said solder wettable material is selected from one of Ni/Au, Sn, Pb, SD/Pb, and Ag.

5. The package according to claim 1, wherein said substrate further comprises a plurality of dielectric layers, each formed on a respective sidewall of a respective one of said conductive lines beneath said dielectric layer structure and on a respective sidewall of a respective one of said bump pads beneath said solder wettable material, wherein said dielectric layers are made of a solder non-wettable material.

6. The package according to claim 5, wherein said solder non-wettable material is metal oxide.

7. The package according to claim 1, wherein said package is a molding compound packaging mode.

8. The package according to claim 1, wherein said package is an underfill package mode.

* * * * *